United States Patent
Le et al.

(10) Patent No.: US 10,442,686 B2
(45) Date of Patent: Oct. 15, 2019

(54) METHOD FOR MANUFACTURING A HOLLOW MEMS STRUCTURE

(71) Applicant: Danmarks Tekniske Universitet, Kgs. Lyngby (DK)

(72) Inventors: Hoa Thanh Le, Virum (DK); Anpan Han, Bagsvaerd (DK); Karen Birkelund, Copenhagen (DK); Anders Michael Jorgensen, Hillerod (DK); Flemming Jensen, Gentofte (DK)

(73) Assignee: Danmarks Tekniske Universitet, Kgs, Lyngby (DK)

( * ) Notice: Subject to any disclaimer, the term of this patent is extended or adjusted under 35 U.S.C. 154(b) by 0 days.

(21) Appl. No.: 16/062,312

(22) PCT Filed: Sep. 19, 2016

(86) PCT No.: PCT/EP2016/072177
§ 371 (c)(1),
(2) Date: Jun. 14, 2018

(87) PCT Pub. No.: WO2017/108218
PCT Pub. Date: Jun. 29, 2017

(65) Prior Publication Data
US 2018/0370792 A1    Dec. 27, 2018

(30) Foreign Application Priority Data

Dec. 23, 2015 (EP) .................................. 15202490

(51) Int. Cl.
*H01L 21/00* (2006.01)
*B81C 1/00* (2006.01)
(Continued)

(52) U.S. Cl.
CPC ...... *B81C 1/00119* (2013.01); *H01F 17/0006* (2013.01); *H01L 23/53295* (2013.01)

(58) Field of Classification Search
CPC ........... H01L 23/53295; H01F 17/0006; B81C 1/00119
(Continued)

(56) References Cited

U.S. PATENT DOCUMENTS 7,545,001 B2 * 6/2009 Cheng ............. H01L 21/823814
257/357
8,354,325 B1  1/2013 Dao et al.
(Continued)

OTHER PUBLICATIONS

International Search Report PCT/ISA/210 for PCT/EP2016/072177 dated Oct. 12, 2016.
(Continued)

*Primary Examiner* — David S Blum
(74) *Attorney, Agent, or Firm* — Harness, Dickey & Pierce, P.L.C.

(57) ABSTRACT

The present invention relates to a method for manufacturing an at least partly hollow MEMS structure. In a first step one or more through-going openings is/are provided in core material. The one or more through-going openings is/are then covered by an etch-stop layer. After this step, a bottom electrically conducting layer, one or more electrically conducting vias and a top electrically conducting layer are created. The bottom layer is connected to the vias and vias are connected to the top layer. The vias are formed by filling at least one of the one or more through-going openings. The method further comprises the step of creating bottom and top conductors in the respective bottom and top layers. Finally, excess core material is removed in order to create the at least partly hollow MEMS structure which may include a MEMS inductor.

20 Claims, 7 Drawing Sheets

(51) Int. Cl.
*H01F 17/00* (2006.01)
*H01L 23/532* (2006.01)

(58) Field of Classification Search
USPC .......................................... 438/50
See application file for complete search history.

(56) References Cited

U.S. PATENT DOCUMENTS

| | | | |
|---|---|---|---|
| 8,399,911 B2 * | 3/2013 | Derluyn | H01L 29/66431 |
| | | | 257/192 |
| 2006/0128036 A1 | 6/2006 | Brennan et al. | |
| 2010/0123451 A1 * | 5/2010 | Freer | H02J 5/005 |
| | | | 323/356 |
| 2011/0043297 A1 * | 2/2011 | Stevenson | A61N 1/37 |
| | | | 333/12 |

OTHER PUBLICATIONS

Written Opinion of the International Searching Authority PCT/ISA/237 for PCT/EP2016/072177 dated Oct. 12, 2016.
International Preliminary Report on Patentability dated Jul. 5, 2018 issued in corresponding International Application No. PCT/EP2016/072177.

* cited by examiner

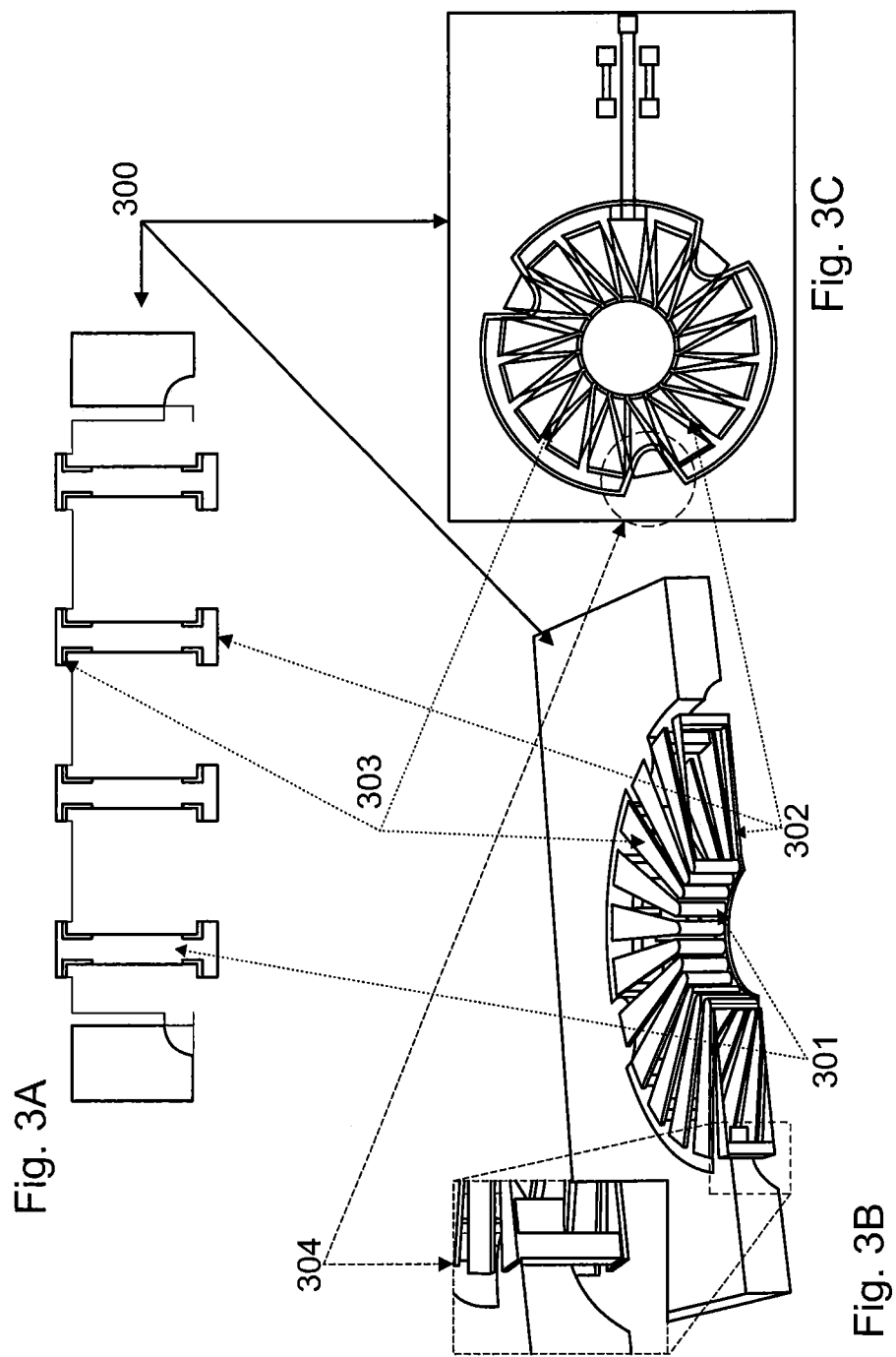

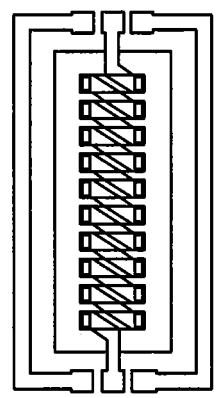
Fig. 4C
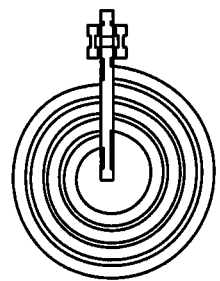
Fig. 4B
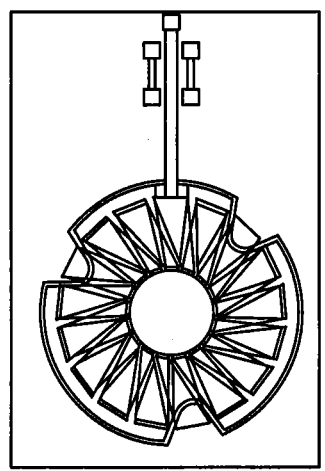
Fig. 4A
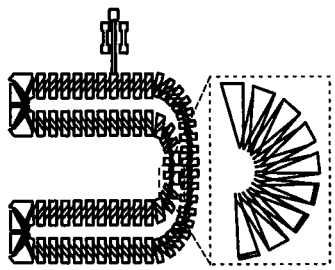
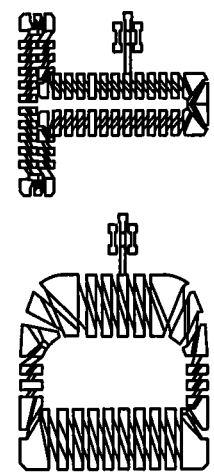
Fig. 4E
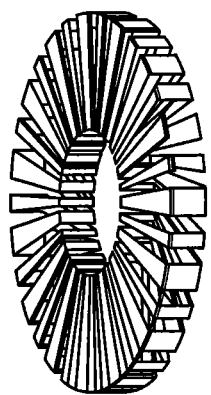
Fig. 4D

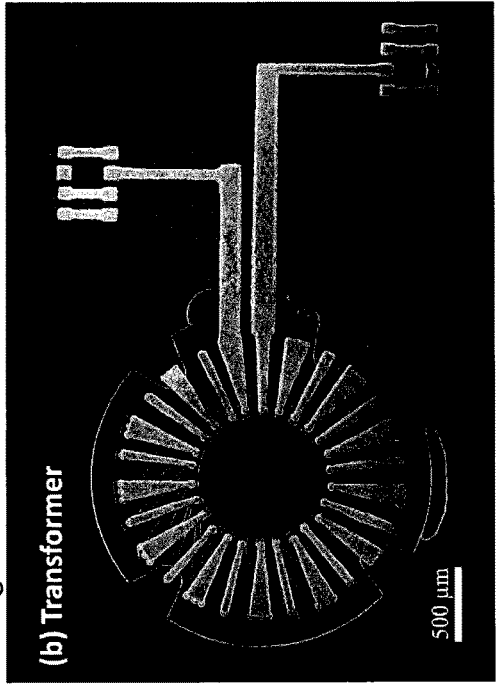
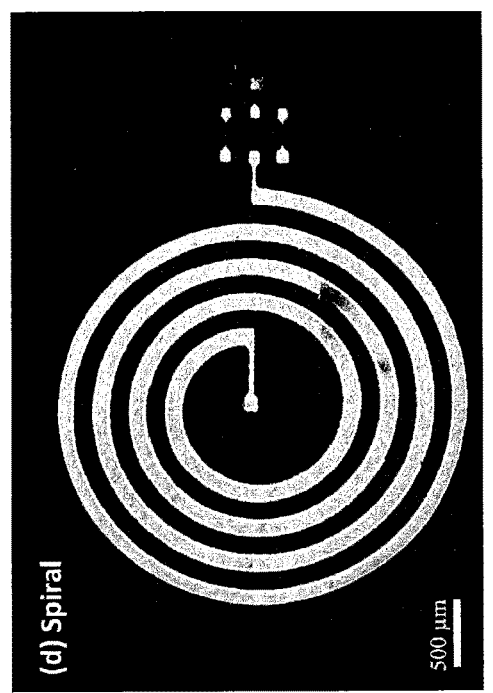
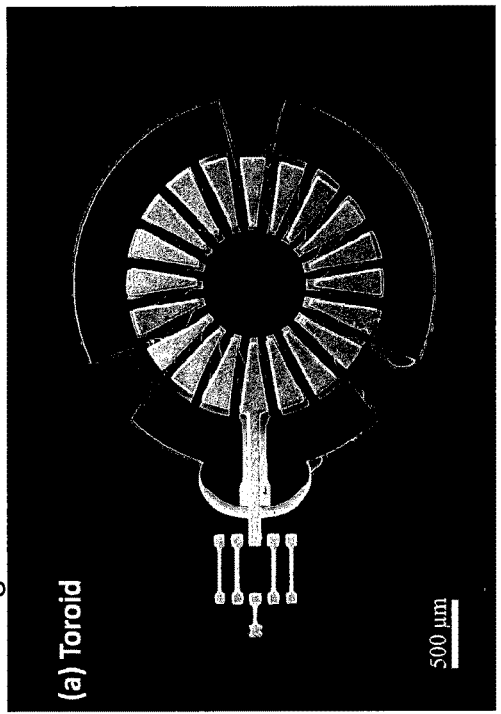
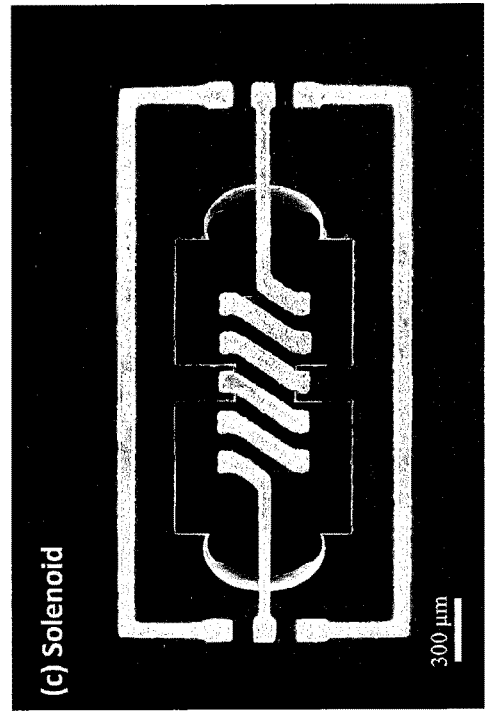
Fig. 5A (a) Toroid
Fig. 5B (b) Transformer
Fig. 5C (c) Solenoid
Fig. 5D (d) Spiral

METHOD FOR MANUFACTURING A HOLLOW MEMS STRUCTURE

CROSS-REFERENCE TO RELATED APPLICATIONS

This is a national phase under 35 U.S.C. § 120 to, PCT International Application No. PCT/EP2016/072177, which has an international filing date of Sep. 19, 2016 which claims priority to European Patent Application No. 15202490.7, filed Dec. 23, 2015 the entire contents of each of which are hereby incorporated by reference.

FIELD OF THE INVENTION

The present invention relates to a method for manufacturing an at least partly hollow micro-electro-mechanical system (MEMS) structure and a MEMS structure manufactured by the method. In particular, the invention relates to a method for manufacturing MEMS inductor.

BACKGROUND OF THE INVENTION

Various semiconductor devices and more particularly inductors for semiconductor chips have been suggested over the years. For example, U.S. Pat. No. 8,354,325 discloses a MEMS inductor having a toroidal shape and a semiconductor core material.

The design suggested in U.S. Pat. No. 8,354,325 is however disadvantageous in that the inductor has a core which is made of a semiconductor material. The semiconductor core of the inductor will limit the operational frequency as well as the quality factor of a device incorporating such an inductor. To be more specific, the semiconductor core will result in additional losses at operational frequencies above 100 MHz due to induced Eddy currents in the silicon core. Thus, there seems to be a need for miniature and low-loss electronic components.

It may be seen as an object of embodiments of the invention to provide a manufacturing process by which an at least partly hollow MEMS structure may be manufactured.

It may be seen as a further object of embodiments of the invention to provide a manufacturing process by which an at least partly hollow MEMS inductor may be manufactured.

DESCRIPTION OF THE INVENTION

The above-mentioned objects are complied with by providing, in a first aspect, a method for manufacturing an at least partly hollow MEMS structure, the method comprising the steps of:
a) providing a core material;
b) creating one or more through-going openings in the core material, said one or more through-going opening being structured in accordance with a predetermined pattern;
c) providing an etch-stop layer to surfaces of the one or more through-going openings;
d) creating, on a first surface of the core material, a bottom layer of a first electrically conducting material;
e) creating one or more vias by filling at least one through-going opening with a second electrically conducting material, the one or more vias being electrically connected to the bottom layer;
f) creating, on a second surface of the core material, a top layer of a third electrically conducting material, the top layer being electrically connected to the one or more vias;
g) creating bottom and top conductors in the respective bottom and top layers; and
h) removing excess core material to create the at least partly hollow MEMS structure.

The core material may comprise any semiconductor material such as silicon, germanium, silicon-nitride, gallium-arsenide, indium-phosphide, aluminium-nitride or other III-V semiconductor alloys. The core material may also comprise different layers of the aforementioned semiconductors or it may be silicon-on-insulator (SOI).

In case the core material comprises a silicon wafer, the wafer may be polished on its top and bottom side. Such a wafer is called a double-side polished (DSP) wafer. The thickness of the wafer may vary. For example, standard DSP silicon wafers have a thickness of 100 µm, 280 µm, 350 µm, 525 µm.

Having provided the core material, the next step in the fabrication may be the formation of one or more through-going openings in the substrate in accordance with a predetermined pattern. This pattern may typically be formed by ultra-violet (UV) lithography after applying a photoresist mask to top and bottom surfaces of the substrate. The mask may be applied by a standard method for applying photoresist coatings, such as high-speed centrifugal whirling, i.e. spin-coating. The pattern may define a path for creating one or more through-going openings which may be created in one of the next fabrication steps. According to the invention, the predetermined pattern may be defined at least by a photoresist layer in combination with an insulator layer serving as an etch-stop layer directly applied on both sides of a blank wafer. This insulator layer may be aluminium-oxide, $Al_2O_3$ and is preferably as thin as possible. A technique such as atomic layer deposition (ALD) may be used, since it enables the formation of a layer as thin as 50 nm.

Areas of the substrate and the insulator which are not covered by the mask may be exposed to a reactive acid during the etching process. Firstly the insulator may be etched in buffered hydrofluoric acid (BHF). The etching process of the substrate may include plasma etching, chemical wet etching, ion beam etching, reactive-ion etching (RIE), deep reactive-ion etching (DRIE), or similar. According to the invention, DRIE may be used to ensure highly selective etching of the wafer and creation of the openings which extend through the entire thickness of the wafer. Through-going openings formed in this way may show a high aspect ratio (AR). For example, the width of the openings may be 20 µm while the thickness of the wafer is 350 µm leading to an AR of 17. The vias may have an aspect ratio being higher than 17, such as higher than 26. The AR is limited by the etching process. The etching process may also be used for formation of anchor trenches. The anchor trenches may not extend through the entire thickness of the wafer. They may have a width which is smaller than the through-going openings, such as 5-15 µm, and preferably 7 µm, and such as 1-5 µm and preferably 3 µm. After the etching process remaining photoresist may be removed by stripping with oxygen $O_2$. Remaining $Al_2O_3$ layer is also removed with BHF. As a preparation for the next fabrication step standard RCA cleaning may be performed.

The next step in the fabrication of an at least partly hollow MEMS structure may involve a deposition of a new thin etch-stop insulation layer, applied over surfaces of the one or more through-going openings. The insulation layer may be deposited both on the top and bottom surface of the substrate, and on the walls of the formed openings. The insulation layer may include any type of insulator, such as silicon-oxide, silicon-nitride, aluminium-oxide, etc. The deposition of the layer may be performed by chemical vapour deposition (CVD) or atomic layer deposition (ALD). The insulation layer may be aluminium-oxide, $Al_2O_3$, formed by the ALD technique. The main purpose of this thin insulation layer may be to protect electrical vias which may be formed in the next fabrication step. After the insulator deposition, a layer of, typically, silicon-oxide may be applied on the top and bottom surface of the substrate. This layer may be 1.5 μm thick and may be applied by plasma enhanced chemical vapour deposition (PECVD). This layer seals 3 μm wide anchor trenches, and avoids defects on top conductors.

After the insulation layer is deposited, the substrate is ready for deposition of an electrically conducting material. Firstly, a first surface of the core material may be covered with a bottom layer of a first electrically conducting material which may create bottom layer and seals the through-going openings. Before the application of another layer of an electrically conducting material, the bottom layer of the first electrically conducting material may be coated with a photoresist to avoid further deposition of material on the bottom layer. The bottom layer may be provided using an electroplating process. This layer may have a thickness of 30 μm.

The formed structure may be flipped around, so that it is prepared for a further step in which, one or more vias may be created by filling at least one through-going opening with a second electrically conducting material. The openings may be filled in a way which ensures that the created vias are electrically connected to the bottom layer. The application of an electrically conducting material is finished after the formation of a top layer of a third electrically conducting material on a second surface of the core material by chemical mechanical planarization (CMP). The top layer may be electrically connected to the one or more vias and may have a thickness of 30 μm.

According to the invention, the first, second and third electrically conducting materials may be provided using an electroplating process. An electrically conducting material may include any metal such as copper, silver, gold, aluminium, etc. According to one embodiment of the invention, the first, second and third electrically conducting materials are the same material, such as for example copper. The vias may be formed by growing copper on the bottom copper layer. To ensure high-quality growth from the backside to the frontside and a good electrical connection between the layers of the electrically conducting materials, a copper tape or a dedicated wafer holder may be used to serve as a wafer holder.

The next fabrication step is may involve creation of bottom and top conductors (windings) in the respective bottom and top layers. According to the invention, the bottom and top conductors may be created using a photoresist patterning process in combination with an etching process. Depending on the metal used for electroplating, different etching techniques may be used, such as plasma etching, wet etching, RIE, etc. Typically, if the metal layer is copper, wet etching with a phosphoric ($H_3PO_4$) or nitric acid ($HNO_3$) is used. This step defines the top and bottom conductors of the final device.

Alternatively, creation of the vias and windings may be performed using a well-known process in which a photoresist mask, which defines the windings, may be applied over $SiO_2$ layer. After the mask is written, an electrically conducting material may be applied. By this, both the vias and top conductors will be created. The created vias are hollow unlike the one created with copper filling which are solid. To create the top/bottom conductors, the structure may be flipped around, the photoresist mask may be applied and the electrically conducting material would be deposited. Finally, the mask will be removed.

To obtain an at least partly hollow MEMS structure, excess core material needs to be removed. In preparation for the core material removal, an additional layer of $Al_2O_3$ may be applied over the entire structure. This layer may be thicker than 20 nm, such as 50 nm thick, and being in a range such as 20-100 nm, and serves as an additional precaution from plasma environment which may be needed for core removal. Spray-coating of photoresist may also be needed to uniformly cover the top and bottom conductors, i.e. windings. Photolithography may then be performed on top side followed by BHF etching of $Al_2O_3$ and $SiO_2$ to expose the core material for removal.

Removal of the majority of the substrate may be performed by etching. According to the invention, selective removal of Si core may be performed by isotropic inductively coupled plasma (ICP) etch. During this process, the vias will be fully protected by the insulation layer of $Al_2O_3$ formed earlier. If the substrate is DSP silicon wafer, an isotropic or combined isotropic and anisotropic dry etching may be applied. Wet etching with potassium hydroxide (KOH) may also be used. Removing the substrate leaves the electrical vias to be surrounded by air.

After the removal of the excess core material, an at least partly hollow core MEMS structure may be obtained. According to the invention, an additional etching step may follow the core material removal. In this etching step, the etch-stop layer, applied after the formation of through-going openings, may be removed. Typically, this is performed by BHF etching.

In a second aspect the present invention relates to a MEMS structure being manufactured using the method according to the first aspect. According to the invention, the MEMS structure may form at least part of a MEMS inductor. Usually, the MEMS inductor may be a part of a semiconductor chip, i.e. it can be integrated on the same substrate together with other components. To ensure the connection with the substrate, removal of the excess substrate material may be performed so that at least a portion of the substrate is kept in order to form an anchor, which surrounds a portion of at least one via. The anchor supports, holds, and stabilizes the whole inductor and makes a connection with the rest of the devices which may be integrated on a semiconductor chip.

The fabricated hollow core MEMS inductor may have a high operational frequency, such as between 300 MHz and 3 GHz since there will be no loss induced by the core material which has been removed. Additionally, the MEMS inductors may have an efficiency being higher than 90%. Finally, MEMS inductors may be manufactured with a high degree of reproducibility and reliability.

The manufacturing process according to the present invention is advantageous in that it is highly flexible allowing for obtaining inductors with different shapes. According to the invention, the MEMS inductor may include a toroidal-shaped inductor, a spiral-shaped inductor or a solenoid-shaped inductor, i.e. the vias may be arranged to form a toroidal hollow-core inductor, a spiral hollow-core inductor or a hollow-core solenoid. In case of a toroidal inductor, the electrically conducting paths may be arranged in two concentric circuits. The inner circuit may comprise the electrically conducting paths having smaller width compared to the electrically conducting paths comprised in the outer circuit. The inner and outer electrically conducting paths may be connected via trapezoidal top and bottom conductors. A toroidal inductor with various diameters is possible to fabricate. For a reliable toroidal inductor at least three vias should be surrounded by the anchors.

In order to change the inductivity of a fabricated hollow-core inductor it is possible to replace an air-core with a magnetic one by using a magnetic paste which can penetrate through the encapsulated inductor.

The present invention further relates to a switch-mode power supply unit comprising a MEMS structure fabricated by the method described above. Such switch-mode power supplies may provide voltages in a wide range from a few hundred mV up to 50 V and may be made in an extremely small size down to a few hundred nanometers. The power supplies may be used in a range of applications, such as to power LEDs, personal computers, mobile phones, etc.

BRIEF DESCRIPTION OF THE DRAWINGS

The invention will now be described in further details with reference to the accompanying drawings, in which:

FIGS. 3A-3C illustrate a relation between a 2D cross-section, a 3D perspective view and a top view of a hollow-core toroidal inductor, FIGS. 4A-4E illustrate different hollow-core MEMS inductors, and FIGS. 5A-5E illustrate SEM micrographs of MEMS hollow-core inductors and transformers.

Figure 1A:
FIGS. 1A-1L illustrate a 2D cross-section of an at least partly hollow MEMS structure in different stages of its fabrication.

While the invention is susceptible to various modifications and alternative forms, specific embodiments have been shown by way of example in the drawings and will be described in detail herein. It should be understood, however, that the following description relates to examples of embodiments, and the invention is not intended to be limited to the particular forms disclosed. Rather, the invention covers all modifications, equivalents, and alternatives falling within the spirit and scope of the invention as defined by the appended claims.

DETAILED DISCLOSURE OF THE INVENTION

In its most general aspect, the present invention relates to a method for manufacturing an at least partly hollow MEMS structure. The manufacturing process involves four main steps: formation of one or more through-going openings, filling of said openings, top and bottom conductors patterning, and removal of excess substrate to obtain an at least partly hollow MEMS structure. The method provides a simple, cost-effective, highly flexible fabrication, performed at low temperatures, resulting in devices of small size, high efficiency and high reliability, for high frequency applications.

The present invention further relates to a MEMS inductor, such as a toroidal hollow-core inductor, a spiral hollow-core inductor, a hollow-core solenoid or a hollow-core inductor of any shape, fabricated by the above mentioned method. Thanks to its small size, high efficiency and high reliability, the hollow-core MEMS inductors, according to the present invention, may advantageously be used in a wide variety of applications, such as chargers for phones and laptops, power supplies for light-emitting diodes (LEDs), magnetic sensors, antennas, and many others.

In FIGS. 1A-1L, detailed fabrication steps of an at least partly hollow MEMS structure are shown. FIG. 1A shows a DSP core material, i.e. wafer 100 with a thin etch-stop layer 101. The wafer 100 may comprise any semiconductor material such as silicon, germanium, silicon-nitride, gallium-arsenide, indium-phosphide, aluminium-nitride or other III-V semiconductor alloys. It may also comprise different layers of aforementioned semiconductors or it may be a SOI. The wafer is fabricated by conventional processes. The etch-stop layer 101 may comprise an insulator, such as aluminium-oxide silicon-oxide, silicon-nitride, etc.

Figure 1B:
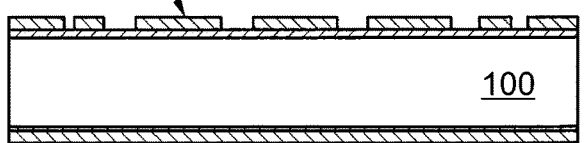

FIG. 1B illustrates the wafer 100 with a photoresist mask 102 applied to the top and bottom surfaces of the wafer. The mask may be applied by a standard method for applying photoresist coatings, such as high-speed centrifugal whirling. The photoresist mask 102 is additionally patterned according to a predetermined pattern, typically by UV lithography.

Figure 1C:
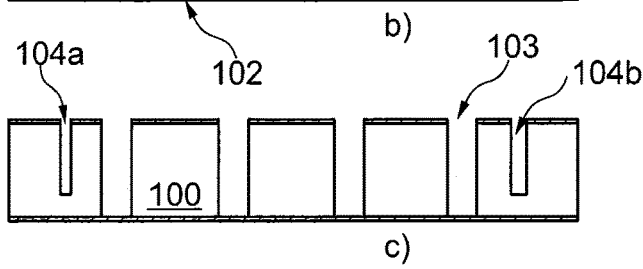

FIG. 1C illustrates the wafer 100 with through-going openings 103 and trenches 104a and 104b for the formation of anchors. The openings 103 and trenches 104 are formed according to a pattern shown in FIG. 1B. They may be formed by utilizing an etching process step. The etching process step may include plasma etching, chemical wet etching, BHF etching, ion beam etching, RIE, DRIE, or similar. Typically, BHF etching is used to etch the aluminium-oxide layer and DRIE to ensure highly selective etching of the wafer 100.

Through-going openings 103 formed in this way show a high AR. Typically, the width of the openings 103 is 20 µm while the thickness of the wafer 100 is 350 µm leading to an AR of 17. The width of the trenches 104a and 104b is typically 7 µm and 3 µm. The obtained structure shown in FIG. 1C is further BHF etched so that remaining aluminium-oxide is removed resulting in a structure shown in FIG. 1D.

Figure 1D:
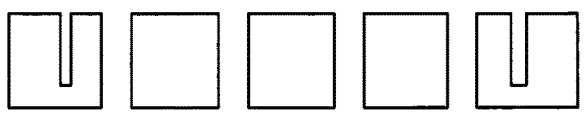
Figure 1E:
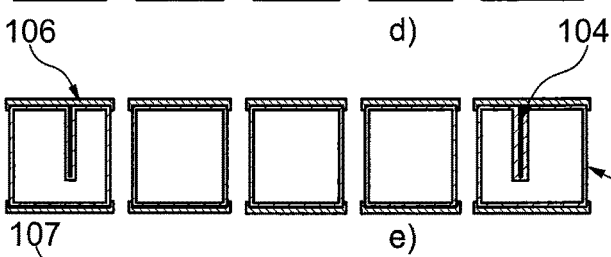

The next step in the fabrication of an at least partly hollow MEMS structure, shown in FIG. 1E, is a deposition of a new thin etch-stop insulation layer 105 over the structure shown in FIG. 1D. The insulation layer 105 is deposited both on the top and bottom surface of the substrate, on the walls of the formed openings 103, as well as on the anchor trenches 104. The insulation layer may include any type of insulator, such as silicon-oxide, silicon-nitride, aluminium-oxide, etc. The deposition of the layer may be performed by CVD, sputtering or ALD. Typically, this insulation layer is as thin as possible and the ALD technique is therefore preferred. After the insulator deposition, a layer 106 of, typically, silicon-oxide is applied on both top and bottom of the structure. The main purpose of the layer 106 is to close anchor trenches 104. PECVD is typically used for this step.

Figure 1F:
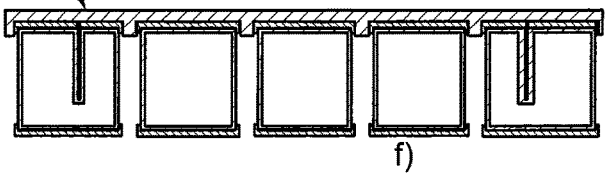

After the insulation and silicon-oxide layers have been deposited, the substrate is ready for electroplating. The electroplating step ensures the formation of a top and bottom layer of electrically conducting material as well as the filling of the openings 103. The electrically conducting layer may include any metal such as copper, silver, gold, aluminium, etc. FIG. 1F illustrates the structure after the formation of a bottom layer 107 of an electrically conducting material.

Figure 1G:
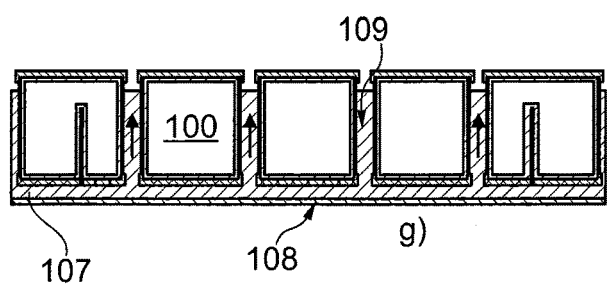
Figure 1H:
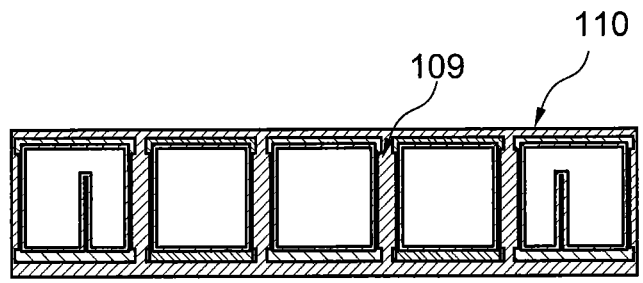

Before the further electroplating process, the bottom layer 107 of an electrically conducting material is coated with a photoresist 108 for protecting the bottom layer 107. The structure from FIG. 1F is flipped around, so that it is prepared for a bottom-up electroplating in which one or more vias are created by filling at least one through-going opening 103 with an electrically conducting material. The structure shown in FIG. 1G is obtained after the bottom-up electroplating. The vias 109 are electrically connected to the bottom layer 107. The vias 109 are usually formed by growing the same electrically conducting material on the bottom layer 107. To ensure high-quality growth from the backside to the frontside and a good electrical connection between the layers of the electrically conducting materials, a copper tape or a dedicated wafer holder may be used to serve as a wafer holder (not shown in the figure). The electroplating process is finished after the formation of a top electrically conducting layer 110. The top layer 110 is electrically connected to the one or more vias 109. Finally, the photoresist 108 is removed. The structure obtained is shown in FIG. 1H.

Figure 1I:
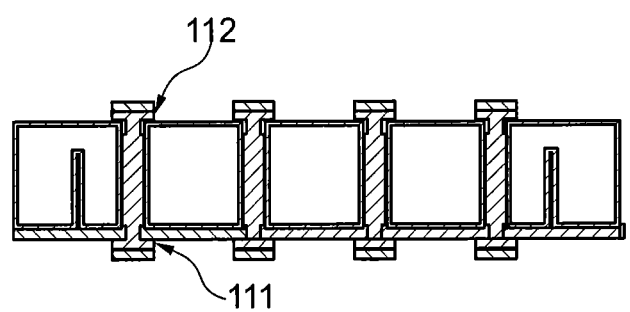
Figure 1J:
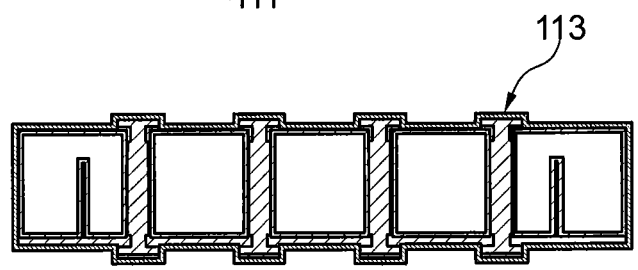

To define the top and bottom conductors, a photoresist mask is applied over the electrically conducting material and further patterned according to a predetermined pattern, typically by UV lithography. FIG. 1I illustrates a structure after a photoresist patterning and etching of the metal. Depending on the metal used for electroplating, different etching techniques may be used, such as plasma etching, wet etching, RIE, etc. Typically, if the metal layer is copper, wet etching with a phosphoric ($H_3PO_4$) or nitric acid ($HNO_3$) is used. This step defines the top conductors 111 and bottom conductors 112 of the final structure.

For the substrate removal, an etching step needs to be performed. In order to protect the top and bottom conductors, a 50 nm thick layer 113 of $Al_2O_3$ is deposited over the entire structure, typically by ALD. This step, shown in FIG. 1J, ensures the encapsulation of the electrically conducting material.

Figure 1K:
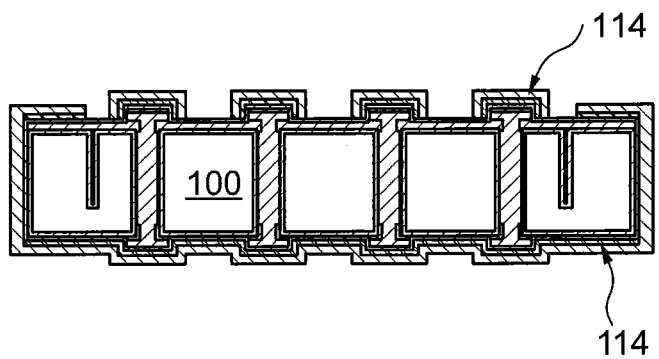

To obtain a hollow-core MEMS structure, the remaining substrate 100 needs to be removed. In preparation for removal of the substrate, a photoresist mask 114 is applied to a surface of the structure and further patterned, typically by spray-coating. The obtained structure with a patterned photoresist mask is shown in FIG. 1K.

Figure 1L:
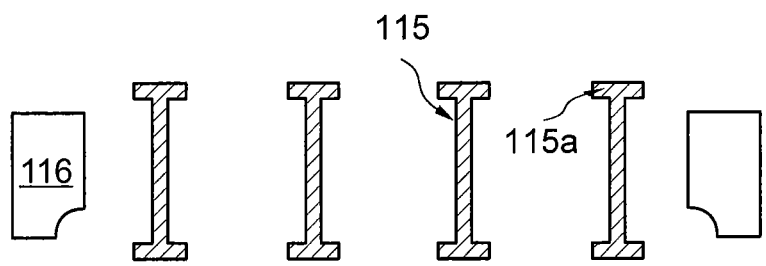

The final hollow-core MEMS structure is shown in FIG. 1L where the majority of substrate 100 is removed leaving the vias 115 to be surrounded by air. 115a represents windings. To obtain the structure shown in FIG. 1L, layers of $Al_2O_3$ and $SiO_2$ had to be removed before the final substrate removal. Typically, both oxide layers are removed by BHF etching. Finally, excess substrate is removed. If the substrate is silicon, an isotropic or combined isotropic and anisotropic dry etching is typically applied. Wet etching with KOH may also be used. The remaining part of the substrate is the anchor 116 supporting the whole structure and making a connection with the rest of the devices which may be integrated on a semiconductor chip. After the final etching step, to etch the substrate away, there is still a layer of oxide surrounding the vias (not shown). This layer may optionally be removed by dipping the structure in BHF.

Figure 2A:
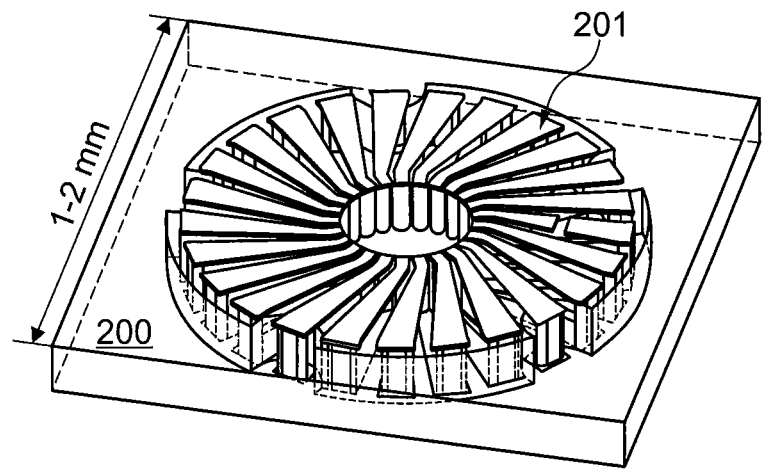
FIGS. 2A-2B illustrate a 3D view of a toroidal hollow-core MEMS inductor.
Figure 2B:
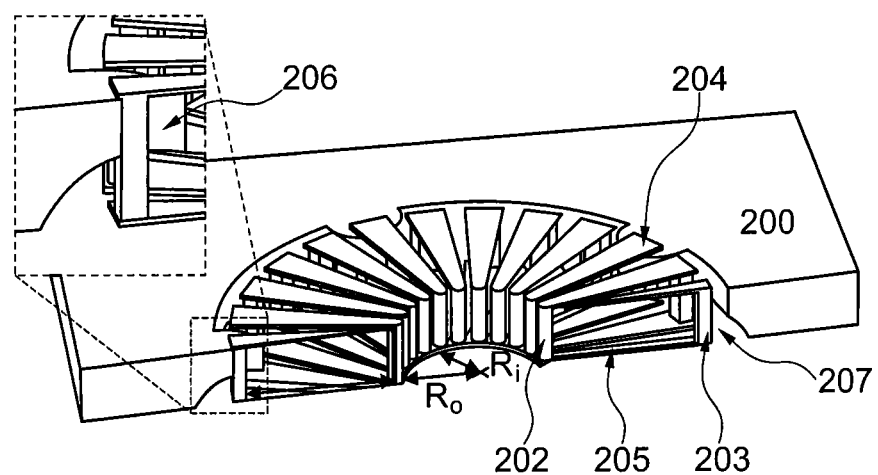

FIGS. 2A-2B illustrate a 3D view of a toroidal hollow-core MEMS inductor. In FIG. 2A, the whole inductor 201 embedded in a wafer 200 is shown. As indicated in the drawings, the size of the inductor may be 1 to 2 mm in diameter. An inductor with both smaller and larger diameter is possible to fabricate. FIG. 2B illustrates a cross-sectional view of the toroidal inductor shown in FIG. 2A. It can be seen that electrically conducting paths, i.e. vias, are arranged in two concentric circuits so as to form the toroidal inductor. The inner circuit with a diameter $R_i$ comprises the vias 202 having smaller width compared to the vias 203 comprised in the outer circuit with a diameter $R_o$. The diameter $R_o$ is obviously larger than the diameter $R_i$. The inner and outer vias are connected via trapezoidal top conductors 204 and bottom conductors 205. In the inset of FIG. 2B, a zoom-in view of the anchor 206 is shown. From this perspective view, the supporting role of the anchor should be clear. The anchor is part of the substrate 200 and in FIG. 2B surrounds a portion of three vias. An air gap 207 is formed between the outer vias 203 and the substrate 200.

FIGS. 3A-3C illustrate a relation between a 2D cross-section, a 3D perspective view and a top view of a hollow-core toroidal inductor. The substrate 300, vias 301, bottom conductors 302, top conductors 303, and the anchor 304 are all indicated in the 2D view shown in FIG. 3A, the 3D perspective view shown in FIG. 3B and the top view, shown in FIG. 3C.

FIGS. 4A-4E illustrate different hollow-core MEMS inductors: a) a toroidal-shaped inductor (FIG. 4A); b) a spiral-shaped inductor (FIG. 4B); c) a solenoid-shaped inductor (FIG. 4C); d) a transformer (FIG. 4D) and e) an unusual-shaped inductor (FIG. 4E). In the inset of FIG. 4E, a part of a toroidal inductor is shown, which is used to form a part of the entire unusual inductor. In principle, an inductor of any shape may be formed by use of portions of the inductors shown in FIGS. 4A, 4B, 4C, and 4D.

Figure 5E:
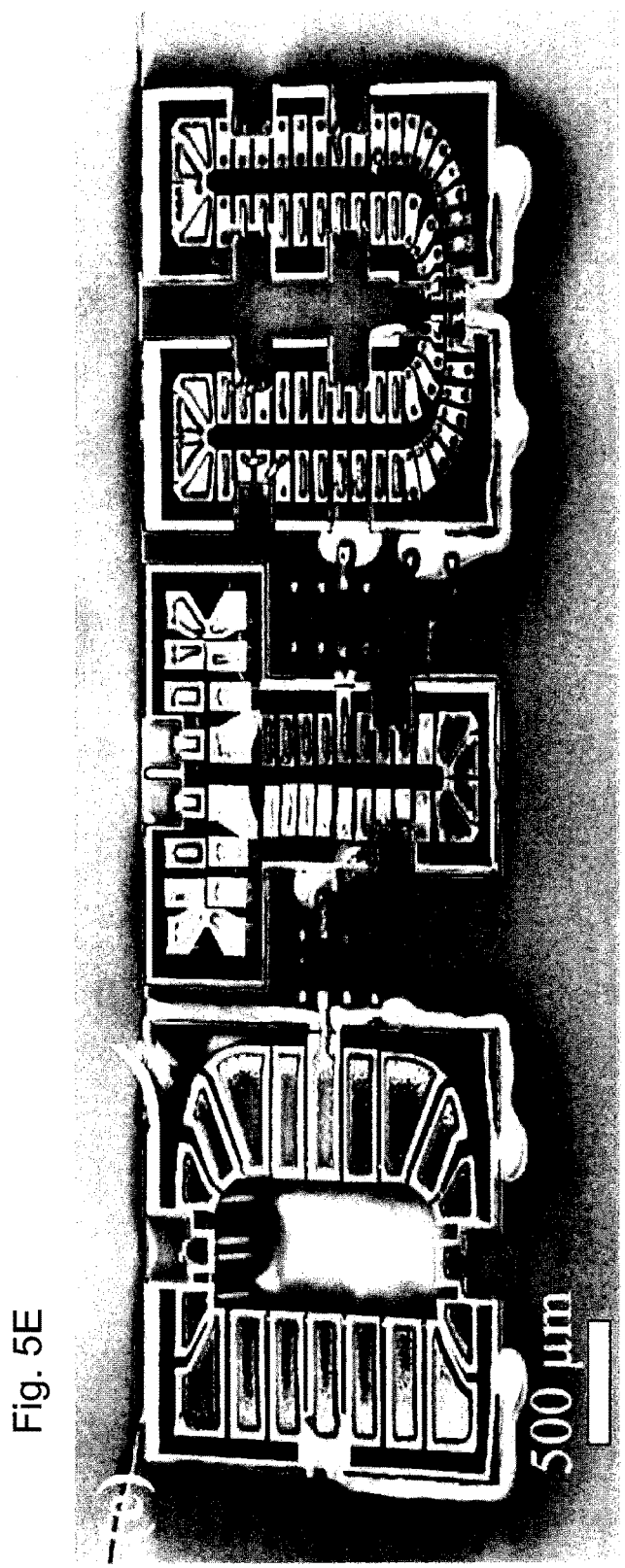

FIGS. 5A-5E show scanning electron microscope (SEM) micrographs of MEMS hollow core transformers and inductors which have been fabricated using the process described above. FIGS. 5A-5Es show a toroidal inductor (FIG. 5A), toroidal 1:1 transformer (FIG. 5B), solenoid inductor (FIG. 5C), spiral inductor (FIG. 5D). In addition, an inductor of arbitrary shape has been made and is illustrated in FIG. 5E. The inductors and the transformer have their respective Si core removed and suspended Cu windings. Device footprint varies from 1 mm² to 16 mm², and the outer radius ($R_o$) varies from 1.5 mm to 4 mm. Maximum number of turns ($N_{max}$) is defined by the inner radius ($R_i$) and winding gap ($G_w$). $R_i$ varies from 0.5 mm to 2 mm giving $N_{max}$ of 20 and 40 turns, respectively. Vias were fabricated with the same diameter of 30 µm, and the wafer thickness is 350 µm. The aspect ratio is 11.6. Typically, toroidal inductors and arbitrary inductors are designed with parallel vias in the outer ring to enhance volume coverage and minimize AC resistance. In addition, the identical diameter of vias helps to achieve uniform through-wafer etching and through-going openings copper filling.

The invention claimed is:

1. A method for manufacturing an at least partly hollow MEMS structure, the method comprising the steps of:
   a) providing a core material;
   b) creating one or more through-going openings in the core material, said one or more through-going openings being structured in accordance with a predetermined pattern, said one or more through-going openings extending through the core material between opposing first and second surfaces of the core material;
   c) providing an etch-stop layer to wall surfaces of the one or more through-going openings such that each though-going opening of the one or more through-going openings is defined by a surface of the etch-stop layer, and further providing the etch-stop layer on both the first and second surfaces of the core material;
   d) creating, on the first surface of the core material, a bottom layer of a first electrically conducting material;
   e) creating one or more vias by filling an entirety of at least one through-going opening as defined by a surface of the etch-stop layer with a second electrically conducting material such that an entirety of side surfaces of the one or more vias are in contact with surfaces of the etch stop layer, the one or more vias being electrically connected to the bottom layer;

f) creating, on the second surface of the core material, a top layer of a third electrically conducting material, the top layer being electrically connected to the one or more vias;

g) creating bottom and top conductors in the respective bottom and top layers; and h) removing a majority of the core material to create the at least partly hollow MEMS structure.

2. A method according to claim 1, wherein the core material comprises a silicon wafer.

3. A method according to claim 1, wherein the predetermined pattern is defined at least by a photoresist layer in combination with an $Al_2O_3$ layer.

4. A method according to claim 1, wherein the one or more through-going openings in the core material are created using a reactive ion etching process.

5. A method according to claim 1, wherein the one or more through-going openings in the core material are created using a dry reactive ion etching process.

6. A method according to claim 1, wherein the etch-stop layer provided to surfaces of the one or more through-going openings is provided using an atomic layer deposition process.

7. A method according to claim 1, wherein the etch-stop layer comprises an $Al_2O_3$ layer.

8. A method according to claim 1, wherein the first, second and third electrically conducting materials are provided using an electroplating process.

9. A method according to claim 1, wherein the first, second and third electrically conducting materials are a same material.

10. A method according to claim 1, wherein the first, second and third electrically conducting materials are copper.

11. A method according to claim 1, wherein the bottom and top conductors are created using a photoresist patterning process in combination with a wet etching process.

12. A method according to claim 1, wherein the removal of the majority of the core material is performed using an etching process.

13. A method according to claim 1, wherein the removal of the majority of the core material is performed using isotropic dry and/or wet etching.

14. A method according to claim 1, further comprising the step of removing the etch-stop layer using an etching process.

15. A MEMS structure manufactured using a method according to claim 1.

16. A MEMS structure according to claim 15, wherein the MEMS structure forms at least part of a MEMS inductor.

17. A MEMS structure according to claim 16, wherein the MEMS inductor forms a toroidal-shaped inductor.

18. A MEMS structure according to claim 16, wherein the MEMS inductor forms a spiral-shaped inductor.

19. A MEMS structure according to claim 16, wherein the MEMS inductor forms a solenoid-shaped inductor.

20. A switch-mode power supply unit comprising a MEMS structure according to claim 15.

* * * * *